US011353486B2

(12) United States Patent
Schaefer et al.

(10) Patent No.: US 11,353,486 B2
(45) Date of Patent: Jun. 7, 2022

(54) CIRCUIT ARRANGEMENT HAVING AN ACTIVE MEASURING VOLTAGE FOR DETERMINING AN INSULATION RESISTANCE AGAINST GROUND POTENTIAL IN AN UNGROUNDED POWER SUPPLY SYSTEM

(71) Applicant: Bender GmbH & Co. KG, Gruenberg (DE)

(72) Inventors: Oliver Schaefer, Gruenberg (DE); Burkhard Macht, Hungen (DE)

(73) Assignee: BENDER GMBH & CO. KG, Gruenberg (DE)

( * ) Notice: Subject to any disclaimer, the term of this patent is extended or adjusted under 35 U.S.C. 154(b) by 0 days.

(21) Appl. No.: 17/103,292

(22) Filed: Nov. 24, 2020

(65) Prior Publication Data

US 2021/0165026 A1    Jun. 3, 2021

(30) Foreign Application Priority Data

Nov. 28, 2019 (DE) ............... 10 2019 132 242.1

(51) Int. Cl.

| G01R 27/18 | (2006.01) |
|---|---|
| G01R 31/52 | (2020.01) |
| G01R 27/02 | (2006.01) |

(52) U.S. Cl.
CPC .......... *G01R 27/18* (2013.01); *G01R 27/025* (2013.01); *G01R 31/52* (2020.01)

(58) Field of Classification Search
CPC ...... G01R 27/18; G01R 27/025; G01R 31/52; G01R 27/08; G01R 31/00
See application file for complete search history.

(56) References Cited

U.S. PATENT DOCUMENTS

2016/0315461 A1* 10/2016 Pieler .................. H02H 3/16

FOREIGN PATENT DOCUMENTS

| CN | 105119257 A | 12/2015 |
|---|---|---|
| DE | 2545325 A1 | 4/1977 |

(Continued)

OTHER PUBLICATIONS

E. Fuchs, et al.; "New Ways in Determining the Earth Fault Duration"; Institute of Electrical Power Systems, University of Technology—Graz.

*Primary Examiner* — Farhana A Hoque
(74) *Attorney, Agent, or Firm* — Dickinson Wright PLLC; Andrew D. Dorisio

(57) ABSTRACT

A circuit arrangement (20) having an active measuring voltage ($U_G$) for determining an insulation resistance ($R_F$) or a complex-valued insulation impedance ($Z_F$) of an ungrounded power supply system (12) against ground potential (PE), the circuit arrangement (20) having a measuring path (24) which runs between an active conductor (L1, L2) of the power supply system (12) and the ground potential (PE) and includes a measuring-voltage generator ($V_G$) for generating the measuring voltage ($U_G$), a measuring resistance ($R_M$) for capturing a measured voltage ($U_M$) and a coupling resistance ($R_A$), the circuit arrangement (20) having a signal evaluation circuit (26) which includes a signal input for evaluating the measured voltage ($U_M$) and a ground connection (GND). The ground connection (GND) is connected to a ground potential (PE).

10 Claims, 7 Drawing Sheets

(56) References Cited

FOREIGN PATENT DOCUMENTS

| DE | 3346387 A1 | 7/1985 |
|---|---|---|
| DE | 102011050590 A1 | 11/2012 |
| DE | 102012019094 A1 | 3/2014 |
| DE | 102014201044 B3 | 3/2015 |

* cited by examiner

State of the Art

# CIRCUIT ARRANGEMENT HAVING AN ACTIVE MEASURING VOLTAGE FOR DETERMINING AN INSULATION RESISTANCE AGAINST GROUND POTENTIAL IN AN UNGROUNDED POWER SUPPLY SYSTEM

This application claims the benefit of German patent application no. 10 2019 132 242.1 filed on Nov. 28, 2019, the disclosure of which is incorporated by reference.

FIELD OF THE INVENTION

The invention relates to a circuit arrangement having an active measuring voltage for determining an insulation resistance or a complex-valued insulation impedance of an ungrounded power supply system against ground potential, the circuit arrangement having a measuring path which runs between an active conductor of the power supply system and the ground potential and comprises a measuring-voltage generator for generating the measuring voltage, a measuring resistance for capturing a measured voltage and a coupling resistance, the circuit arrangement comprising a signal evaluation circuit which comprises a signal input for evaluating the measured voltage and a ground connection.

BACKGROUND

When higher requirements are to be met for operational, fire and contact safety, the network configuration of an ungrounded power supply system is applied which is also referred to as an insulated network or as an IT power supply system (IT: isolé terre in French). With this type of power supply system, the active parts are separate from the ground potential (with respect to "ground"). The advantage of these networks lies in the function of the connected electric users not being impeded when an insulation fault (first fault), e.g., a ground fault of an active conductor of the power supply system, occurs since a closed circuit cannot form because of the ideally infinitely large impedance value between the active conductor of the network and ground. Network leakage capacitances—which form a complex-valued insulation impedance of the power supply system in parallel connections having an insulation resistance—will be left out of rom this discussion. The ungrounded power supply system discussed within the framework of the invention can be an alternating-current or direct-current system or a mixed form of both systems.

The electric resistance of the ungrounded power supply system against the ground potential (insulation resistance; in the event of a fault also an insulation fault resistance or a fault resistance) must therefore be monitored by a standard insulation monitoring device (IMD) according to standard norms since a fault loop could arise via a possible further fault occurring at a different active conductor (second fault) which would cause the flowing fault current in conjunction with an overcurrent protective device to shut off the installation, leading to an operational standstill.

Besides passive insulation monitoring devices, which use a network voltage of the power supply system as a driving source for a measuring current to detect an insulation fault, active insulation monitoring devices are also known from the state of the art. These active insulation monitoring devices have a measuring path which runs between one or more active conductors of the power supply system and the ground potential and comprises an internal measuring-voltage generator. A measuring voltage generated by the measuring-voltage generator actively drives a measuring voltage back to the measuring path via the active conductor(s) and the insulation resistance, the measuring path having a measuring resistance connected in series to the measuring-voltage generator for capturing a measured voltage and a coupling resistance connected in series for being coupled to the power supply system. The voltage drop acquired by the measuring resistance is supplied to a signal evaluation circuit via a signal input for evaluation so as to determine the insulation resistance.

In the simplest case, a single-pole coupling having exactly one measuring path at only one active conductor suffices. In multi-pole ungrounded power supply systems, a coupling to at least two measuring paths can be sensible in order to also measure a network voltage or displacement voltage and to monitor a coupling.

Insulation monitoring devices must also be coupled to one another in ungrounded power supply systems whose configurations are alterable, such as in coupled ungrounded power supply systems on ships where generators which supply different IT networks are connected or disconnected depending on the load condition. In this case, it proves to be disadvantageous that this coupling of the insulation monitoring devices is established via a galvanically isolatable path since the intersections between the insulation monitoring devices are not directly grounded and signal loops can occur as a consequence.

With the hitherto known insulation monitoring devices, the series connection of the measuring path is configured in such a manner that the ground connection of the signal evaluation circuit is not connected to the ground potential. All intersection signals of the insulation monitoring devices are therefore superposed by the (common mode) measuring voltage against ground and must be transferred in a galvanically isolated manner when being integrated in the ungrounded power supply system. No galvanic connection can exist between the insulation monitoring devices or other grounded devices. These galvanically isolated intersections, however, create significant costs as they have to be implemented in each insulation monitoring device. Thus, relays for forwarding alarm messages or data couplers for digital intersections are required for a galvanic isolation.

SUMMARY

The object of the present invention is therefore to describe a circuit arrangement having an active measuring voltage for determining the insulation resistance or for determining the complex-valued insulation impedance and the use of such a circuit arrangement for an ungrounded power supply system, a sophisticated galvanic isolation between insulation monitoring devices while being coupled being dispensable.

This object is attained by the ground connection of the signal evaluation circuit being connected to the ground potential.

The fundamental idea of the invention at hand consequently rests on connecting the ground connection of the signal evaluation circuit to the ground potential. Since a potential gradient does not exist in this case, fault currents (signal loops) can be prevented. All analogous and digital intersections then no longer require galvanic isolation. By eliminating galvanic isolation of all intersections of the signal evaluation circuit including their voltage supply with respect to ground, insulation monitoring devices can be coupled without resulting in erroneous measurements via interfering loop currents.

Advantageously, the measuring path is equipped such that the ground potential, the measuring-voltage generator, the measuring resistance and the coupling resistance make up a series connection in a first order.

Starting from the ground potential, the elements of the measuring path, i.e., the measuring-path elements measuring-voltage generator, measuring resistance and coupling resistance, are disposed in a first order beginning with the measuring-voltage generator, followed by the measuring resistance and culminating in the coupling resistance in this embodiment.

In this first measuring arrangement, a connection of the measuring-voltage generator is connected to ground potential in conjunction with the ground connection of the signal evaluation circuit.

In this context, the voltage measuring only a few volts (in the range of ±2 volts) and measured via the measuring resistance is superposed by the larger (common mode) measuring voltage (in the range of ±20 Volts) so that the signal evaluation circuit has to work with a high common mode suppression for the measured voltages.

Furthermore, a multi-pole coupling in an ungrounded power supply system is provided comprising at least two conductors, at least two of the active conductors each being connected to the ground potential via a measuring path.

In an ungrounded power supply system comprising several active conductors, it thus proves advantageous to install a measuring path for each of the at least two active conductors.

The measuring paths can be entirely separate, i.e., each has their own measuring-voltage generator, measuring resistance and coupling resistance, or at least two measuring paths can comprise a shared measuring-voltage generator.

Alternatively to the first order, the measuring path in a second order is realized such that the measuring path, the measuring-voltage generator and the coupling resistance make up a series connection starting from the ground potential.

In this second measuring arrangement, a connection of the measuring resistance is connected to ground potential in conjunction with the ground connection of the signal evaluation circuit.

Here, the measured voltage is captured directly against ground potential via the measuring resistance; however, the (common mode) measuring voltage is detected differentially. In this case, no high requirements need be fulfilled for the common mode suppression since the differentially detected measuring voltage is significantly greater than the measured voltage applied via the measuring resistance.

Configuring the second order, it can be realized in such a manner in an ungrounded power supply system having at least two active conductors that at least two of the active conductors are each separately connected to the ground potential via a measuring path.

In the same manner as the coupling of several active conductors in the first order, entirely separate measuring paths can be intended for the corresponding active conductor.

To advantageously use embodiments of the circuit arrangement according to the invention—a separate measuring path existing in the first or second order for each embodiment—, the measuring-voltage generators disposed in the corresponding measuring paths generate different measuring voltages so as to test the functionality of the coupling.

This allows monitoring a connection so that line disruptions can be identified in the measuring paths, for example.

During operation of the power supply networks, a low-impedance connection exists between the measuring paths via the source impedance and load impedance of the power supply system to be monitored when the circuit arrangement is multi-pole. If the corresponding driving measuring voltages of the measuring paths are identical, the corresponding measuring current in the coupling paths driven by the corresponding measuring voltage should also be identical. If the measuring voltages between the measuring paths differ, they generate a current via the source impedance and load impedance if the coupling is intact. If this current does not match an anticipated current flow which can be detected from the present load constellations and network properties, an interrupted connection of the measuring path can be identified by this procedure.

Advantageously, the circuit arrangement having a multi-pole coupling can be used via separate measuring paths for simultaneously and actively measuring a corresponding insulation resistance or a complex-valued insulation impedance connected to ground potential in several ungrounded power supply systems, active conductors of different power supply systems being assigned to the measuring paths.

In this configuration, determining an insulation resistance or an insulation impedance simultaneously for several independent power supply systems is only possible using a multi-pole circuit arrangement.

Independent power supply systems are networks which have network voltage sources independent from each other and their own loads.

Since an active conductor from different power supply systems is assigned to each measuring path, the corresponding insulation resistance can be determined for each independent network.

Advantageously, when using the circuit arrangement having a multi-pole coupling via separate measuring paths for several independent power supply systems, different measuring voltages are applied to the corresponding power supply systems for identifying a low-impedance connection between the power supply systems.

This configuration allows determining the insulation resistance or the insulation impedance between two independent power supply systems.

By using different measuring voltages in the measuring paths, a current flow between the power supply systems is set via the measuring paths so that an unintended low-impedance connection (cross fault) of the power supply networks is identified and the elements of this cross fault can be determined according to real and imaginary part.

BRIEF DESCRIPTION OF THE FIGURES

Further advantageous embodiment features are derived from the following description and the drawings which describe preferred embodiments of the invention using examples.

DETAILED DESCRIPTION

Figure 1:
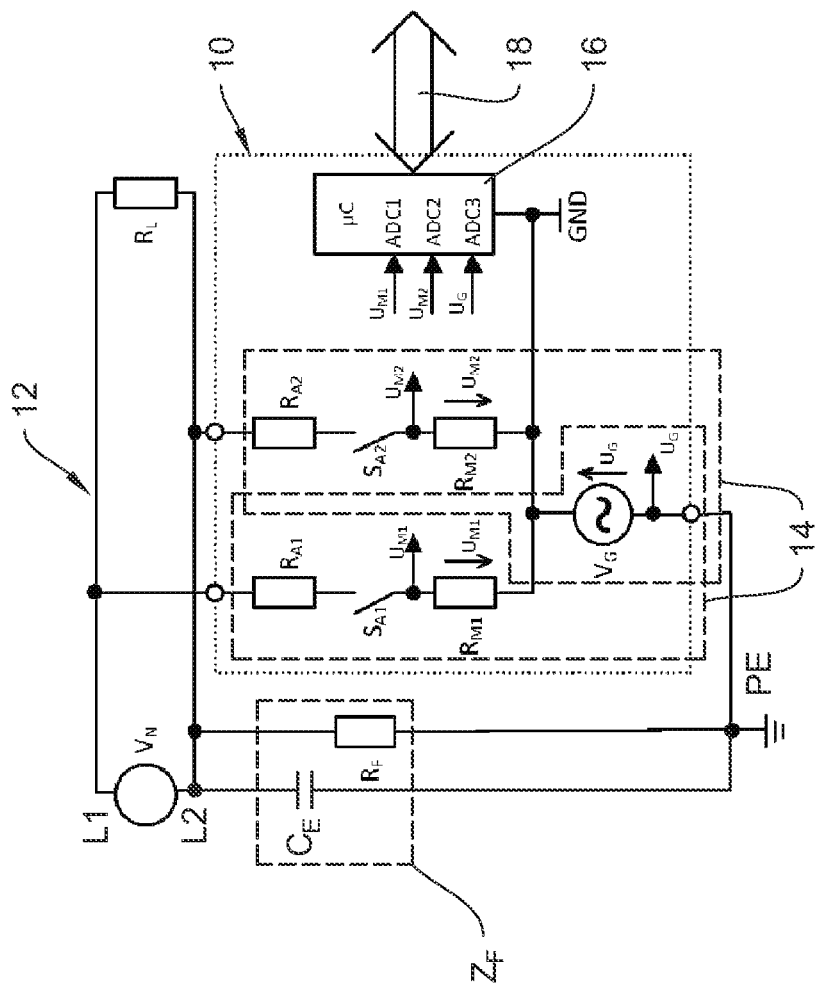
FIG. 1 shows a circuit arrangement for determining an insulation resistance according to the state of the art.

FIG. 1 shows the general set-up of a circuit arrangement 10 for determining the insulation resistance (insulation monitoring device) of an ungrounded power supply system 12. A network voltage source $V_N$ supplies a load $R_L$ via two active conductors L1, L2.

Insulation monitoring device 10 is connected between both active conductors L1, L2 and ground (ground potential) PE, insulation monitoring device 10 being coupled with each active conductor L1, L2 via a branched measuring path 14 so that a closed measuring-current circuit can be formed via active conductors L1, L2 and insulation resistance $R_F$. Power supply system 12 is additionally described by a leakage capacitance $C_E$ which is modeled in the same manner as insulation resistance $R_F$ and forms a complex-valued insulation impedance $Z_F$ in conjunction with insulation resistance $R_F$. In a simplified illustration, this complex-valued $Z_F$ is only illustrated for active conductor L2; generally, however, an insulation impedance $Z_F$ is applied to each active conductor L1, L2.

Starting from ground potential PE, measuring path 14 comprises a measuring-voltage generator $V_G$, a measuring resistance $R_M$ and a coupling resistance $R_A$ ($V_G$, $R_M$, $R_A$ and $S_A$ are to be described here and in the following for all corresponding measuring-path elements $V_{Gi}$, $R_{Mi}$, $R_{Ai}$ and $S_{Ai}$ which all function in the same manner). Optionally, a switch $S_A$ is provided in each measuring path 14 for disconnecting insulation monitoring device 10 from ungrounded power supply system 12.

Measuring-voltage generator $V_G$ generates a measuring voltage $U_G$ which drives a current in the measuring circuit closing via insulation resistance $R_F$, the current leading to a measurable voltage drop $U_M$ (measured voltage) at measuring resistance $R_M$. Measuring voltage $U_G$ and measured voltage $U_M$ are supplied to a signal evaluation circuit 16 to determine insulation resistance $R_F$. For digitally processing input signals, signal evaluation device 16 comprises analog-digital converters ADC and a microcontroller μC along with an intersection 18, e.g., for outputting an alarm signal.

Figure 2:
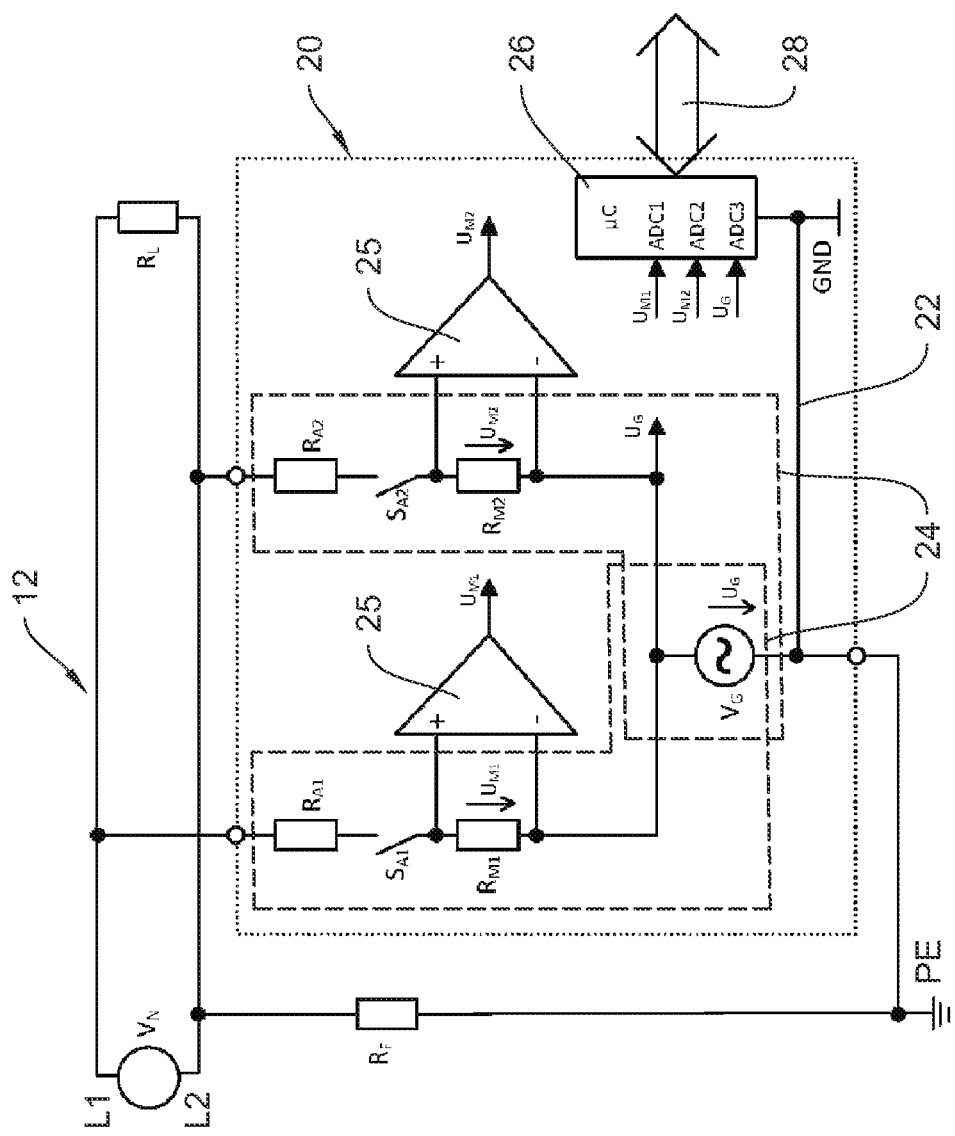
FIG. 2 shows a circuit arrangement according to the invention having measuring-path elements in a first order.

FIG. 2 shows a circuit arrangement 20 according to the invention; starting from ground potential PE, measuring-voltage generator $V_G$, measuring resistance $R_M$ and coupling resistance $R_A$ make up a series connection in branched measuring path 24 in a first order. According to the invention, ground connection GND of signal evaluation circuit 26 is connected to ground potential PE via a galvanic connection 22.

When supplying an alternating-current signal (measuring voltage $U_G$) by means of measuring-voltage generator $V_G$, complex-valued insulation impedance $Z_F$ can be calculated with its components $R_F$ (real part) and $C_E$ (imaginary part) in signal evaluation circuit 26 via digital signal processing algorithms, such as the discrete Fourier Transformation (DFT).

In the illustrated multi-pole coupling, two measuring paths 24 dispose over a shared measuring-voltage generator $V_G$. Alternatively, each measuring path 24 can comprise its own measuring-current generator $V_G$.

In the configuration in this first order, a high common mode suppression for determining measured voltage $U_M$, which was detected via a differential amplifier 25 (instrumentation amplifier), is required since (low) measured voltage $U_M$ is superposed by a (high) common mode measuring voltage $U_G$. Faced with the present voltage conditions—measured voltage $U_M$ is in the range of ±2 Volts with respect to measuring voltage $U_G$ which is in the range of ±20 Volts—, an instrumentation amplifier would be required which has a common mode suppression of at least 120 dB for correctly determining measured voltage $U_M$.

As an alternative to an instrumentation amplifier 25 of this high quality, reaching the required high common mode suppression via galvanic isolation in the signal processing path is therefore ideally suited for measured voltage $U_M$.

Figure 3B:
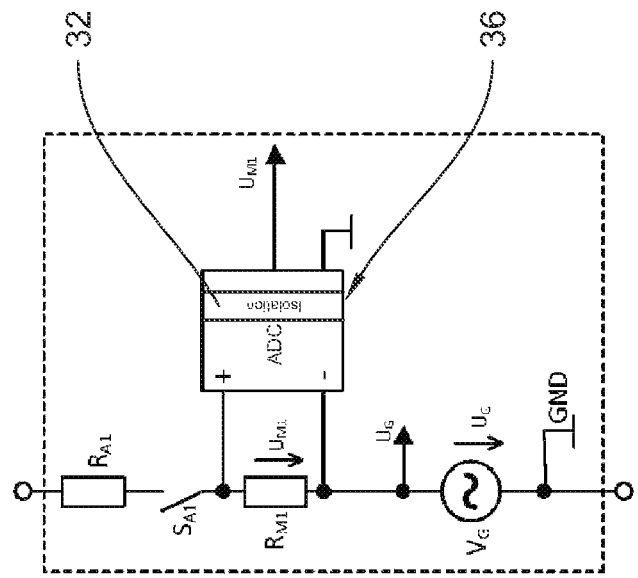
FIG. 3b shows a measuring path with galvanic isolation in the signal processing of the measured voltage.
Figure 3A:
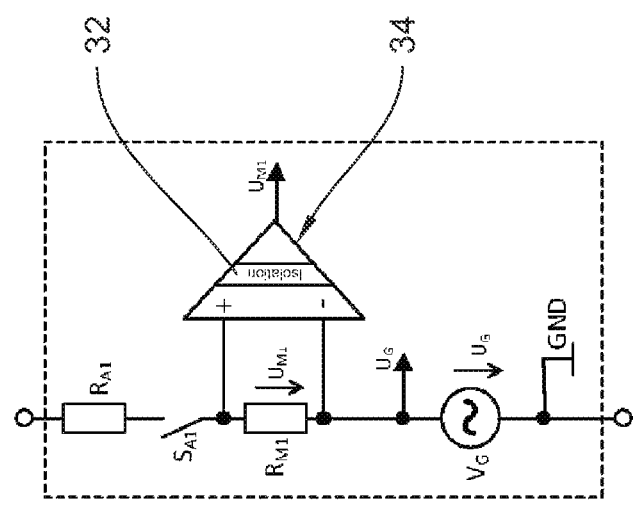
FIG. 3a shows a measuring path with galvanic isolation in a differential amplifier.

FIGS. 3a and 3b show two options with regard thereto. Hence, a galvanic isolation 32 can be intended within, for example, differential amplifier circuit 34 (FIG. 3a) or in signal processing circuit 36 (FIG. 3b) of measured voltage $U_M$.

Figure 4:
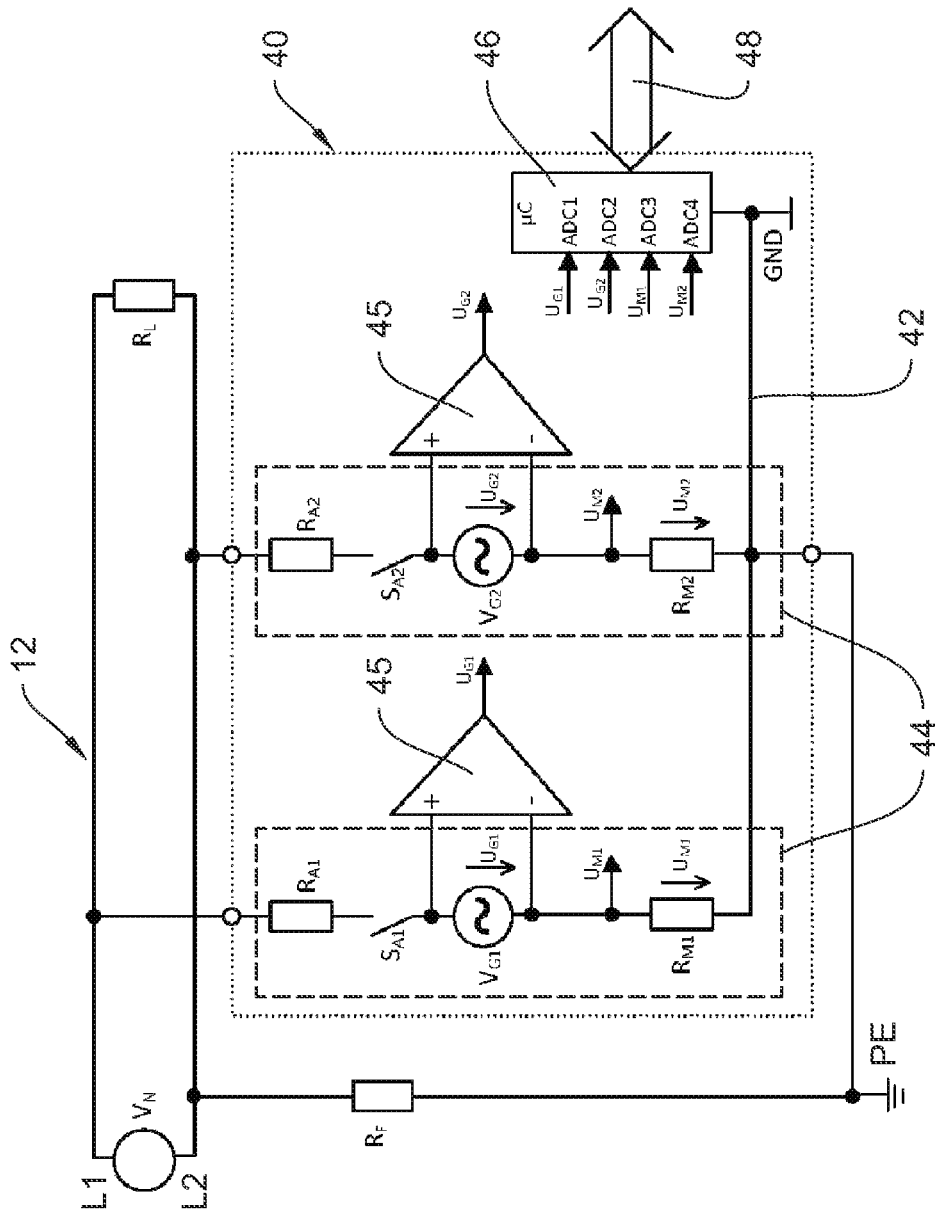
FIG. 4 shows a circuit arrangement according to the invention having the measuring-path elements in a second order.

FIG. 4 shows a circuit arrangement 40 according to the invention for determining insulation resistance $R_F$ in an ungrounded power supply system 12 having a multi-pole coupling. In contrast to the first order illustrated in FIG. 2, the measuring-path elements are disposed in measuring path 44 in a second order starting from ground potential PE, beginning with measuring resistance $R_M$, followed by measuring-voltage generator $V_G$ and culminating in coupling resistance $R_A$. Measured voltages $U_M$ are detected as a voltage drop via the corresponding measuring resistance $R_M$ directly against ground PE and supplied to signal evaluation unit 46 in conjunction with measuring voltages $U_G$ detected differentially via a differential amplifier 45.

According to the invention, signal evaluation unit 46 is connected to ground potential PE via a galvanic connection 42.

Far less requirements need to be fulfilled for the common mode suppression in the signal processing path of measuring voltage $U_G$ since measuring voltage $U_G$ is considerably larger than measured voltage $U_M$.

Figure 5B:
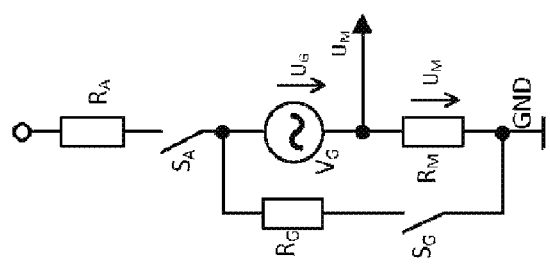
FIGS. 5a, 5b show how the measuring voltage is determined without its own signal processing.
Figure 5A:
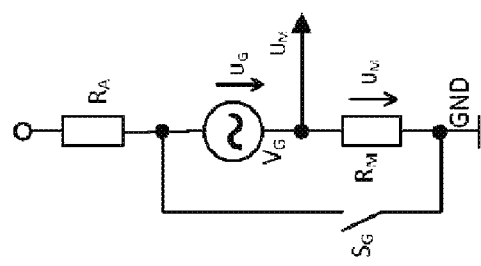

In FIGS. 5a and 5b, two circuit options for determining measuring voltage $U_G$ are illustrated. On principle, measuring voltage $U_G$ is required for determining insulation resistance $R_F$. However, measuring voltage $U_G$ does not necessarily have to be known; via reference measurement with $R_F=0$ Ohms, measuring voltage $U_G$ can refer to this reference measurement value. Measuring voltage $U_G$ does not have to be detected in a synchronous and continuous manner for capturing measured voltage $U_M$. Hence, measuring voltage $U_G$ can be determined for measured voltage $U_M$ by means of signal evaluation circuit 26, 46 by closing a switch $S_G$ disposed parallel to the series connection consisting of measuring-voltage generator $V_G$ and measuring resistance $R_M$, as illustrated in FIG. 5a.

In extension of the circuit from FIG. 5a, (separation) switch $S_A$ can be opened according to FIG. 5b, and measured voltage $U_M$ can be adjusted to the tolerance range of measured voltage $U_M$ by means of a resistance $R_G$ additionally disposed in series to switch $S_G$ while determining measuring voltage $U_G$.

Figure 6B:
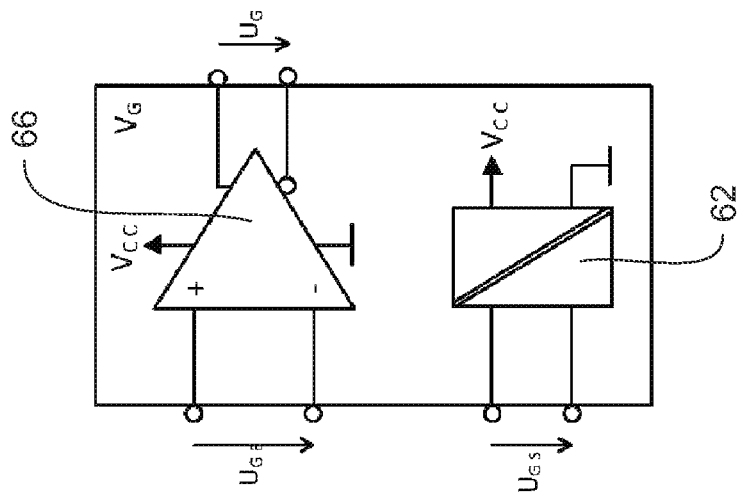
FIGS. 6a, 6b show a measuring-voltage generator with a galvanically isolated supply in two embodiments.
Figure 6A:
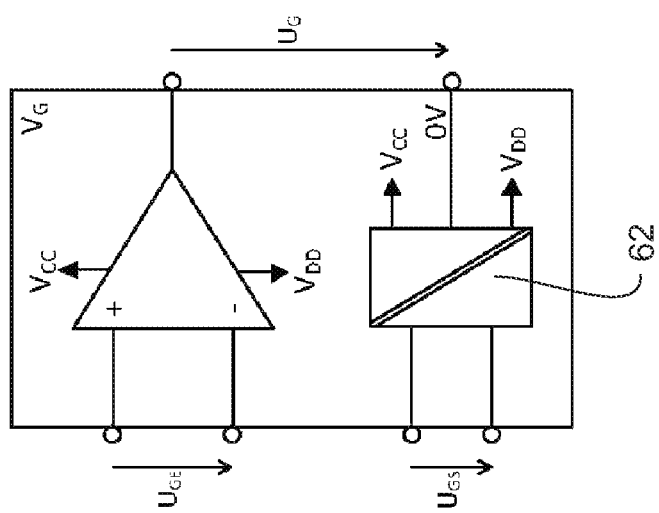

FIGS. 6a and 6b show a measuring-voltage generator $V_G$ having a galvanically isolated supply. To avoid cross flow bypassing measuring resistance $R_M$ against ground connection GND via measuring-voltage generator $V_G$, which would falsify measurements, measuring-voltage generator $V_G$ must comprise a galvanically isolated supply and high-impedance inputs for control. If measuring-voltage generator $V_G$ is to be controlled via an analog signal and if measuring voltage $U_G$ is to be bipolar, as illustrated in FIG. 6a, measuring-voltage source $V_G$ can be set up having a differential amplifier supplied bipolarly via voltages $V_{CC}$ or $V_{DD}$. In this context, supply voltage $U_{GS}$ supplies an internal and galvanically isolated voltage source 62. A control voltage $U_{GE}$ controls bipolar measuring voltage $U_G$.

The complexity of internal and galvanically isolated voltage source 62 can be reduced by using a differential amplifier 66 having a differential output. As illustrated in FIG. 6b, this amplifier type generates bipolar measuring voltage $U_G$ even when a supply is unipolar.

Figure 7:
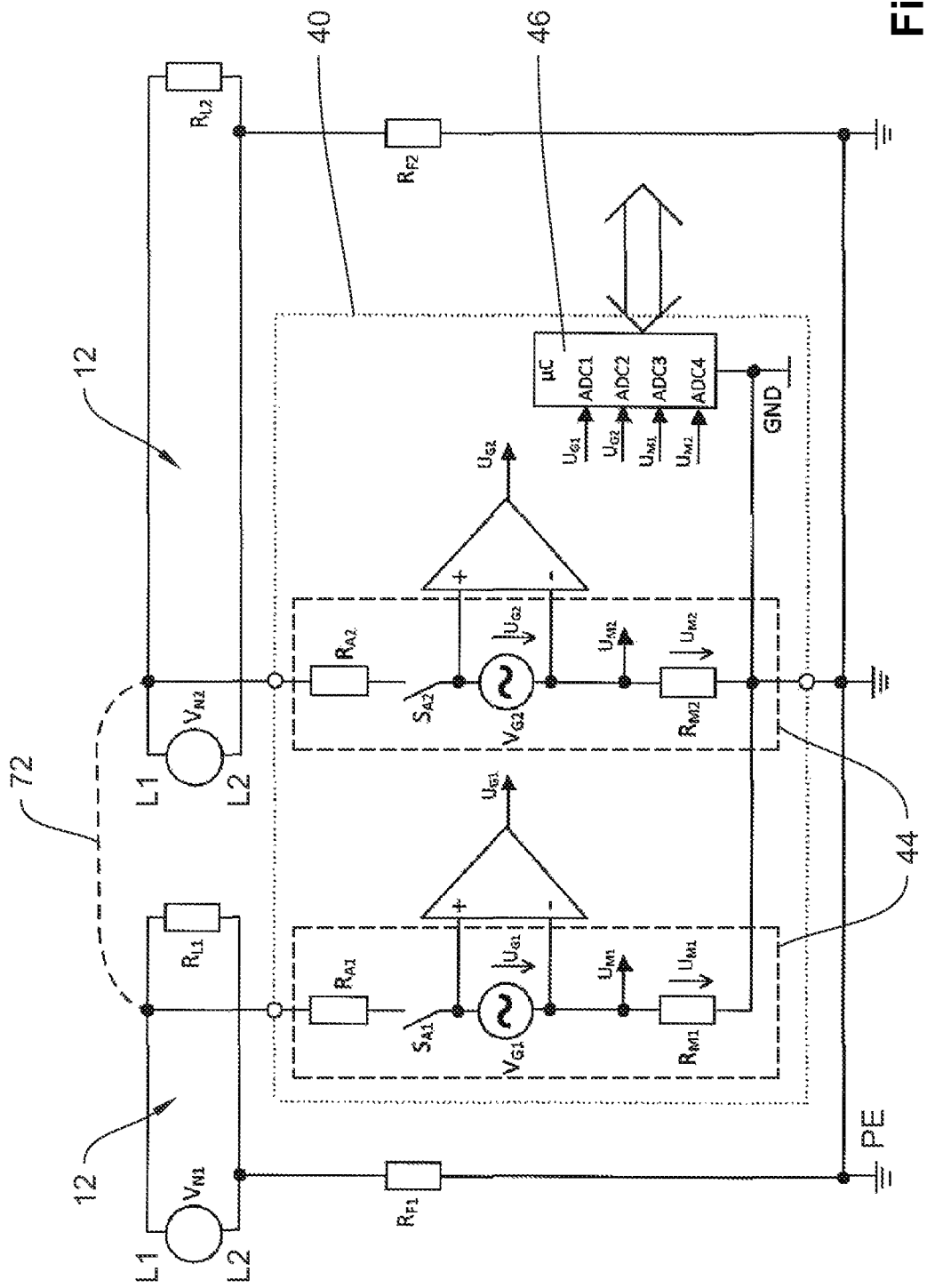
FIG. 7 shows a use of the circuit arrangement according to the invention in independent power supply systems.

FIG. 7 shows a use of circuit arrangement 40 according to the invention in the second order according to FIG. 4 in two independent power supply systems 12.

An active conductor L1 from both independent power supply systems 12 are assigned to each of the two measuring paths 44 so that corresponding insulation resistances $R_F$ of power supply systems 12 can be determined individually from each other in signal evaluation unit 46. This circuit configuration thus enables simultaneously determining corresponding insulation resistance $R_F$ for several independent power supply systems 12 using only one circuit arrangement 40 of the invention, though by all means more than the two power supply systems 12 illustrated in an exemplary manner can be monitored simultaneously. Moreover, a multi-pole coupling to corresponding power supply system 12 also becomes possible with this configuration.

Furthermore, a current flow occurring when measuring voltages $U_G$ are of different magnitudes and a low-impedance connection 72 (cross fault) is present between power supply systems 12 can be detected in measuring paths 44. A cross fault, even a complex-valued one, occurring between power supply systems 12 is thus identified.

The invention claimed is:

1. A circuit arrangement (20, 40) having an active measuring voltage ($U_G$) for determining an insulation resistance ($R_F$) or a complex-valued insulation impedance ($Z_F$) of an ungrounded power supply system (12) against ground potential (PE), the circuit arrangement (20, 40) having a measuring path (24, 44) which runs between an active conductor (L1, L2) of the power supply system (12) and the ground potential (PE) and comprises a measuring-voltage generator ($V_G$) for generating the measuring voltage ($U_G$), a measuring resistance ($R_M$) for capturing a measured voltage ($U_M$) and a coupling resistance ($R_A$), the circuit arrangement (20, 40) comprising a signal evaluation circuit (26, 46) which comprises a signal input for evaluating the measured voltage ($U_M$) and a ground connection (GND), wherein the ground connection (GND) is connected to a ground potential (PE).

2. The circuit arrangement according to claim 1, wherein the ground potential (PE), the measuring-voltage generator ($V_G$), the measuring resistance ($R_M$) and the coupling resistance ($R_A$) make up a series connection in the measuring path (24) in a first order.

3. The circuit arrangement according to claim 2, further including a multi-pole coupling in an ungrounded power supply system (12) having at least two active conductors (L1, L2), at least two of the active conductors (L1, L2) each being connected to the ground potential (PE) via a measuring path (24).

4. The circuit arrangement according to claim 3, wherein the measuring paths (24) are realized individually.

5. The circuit arrangement according to claim 3, wherein at least two measuring paths (24) comprise a shared measuring-voltage generator ($V_G$).

6. The circuit arrangement according to claim 1, wherein the ground potential (PE), the measuring resistance ($R_M$), the measuring-voltage generator ($V_G$) and the coupling resistance ($R_A$) make up a series connection in the measuring path (44) in a second order.

7. The circuit arrangement according to claim 6, further including a multi-pole coupling in an ungrounded power supply system (12) having at least two active conductors (L1, L2), at least two of the active conductors (L1, L2) each being individually connected to the ground potential (PE) via a measuring path (44).

8. A method of using the circuit arrangement (20, 40) having a multi-pole coupling via individual measuring paths (24, 44) according to claim 4, comprising causing the corresponding measuring-voltage generators ($V_G$) to generate different measuring voltages ($U_G$) to test the functionality of the couplings.

9. A method of using the circuit arrangement (20, 40) comprising a multi-pole coupling via individual measuring paths (24, 44) according to claim 4, comprising simultaneous active measuring of a corresponding insulation resistance ($R_F$) or a complex-valued insulation impedance ($Z_F$) against ground potential (PE) in several ungrounded power supply systems (12), active conductors (L1, L2) of different power supply systems (12) being assigned to the measuring paths (24, 44).

10. The method according to claim 9, where different measuring voltages ($U_G$) are applied to the corresponding power supply systems (12) for identifying a low-impedance connection between the power supply systems (12).

\* \* \* \* \*